(12) United States Patent
Coolbaugh et al.

(10) Patent No.: US 8,159,040 B2
(45) Date of Patent: Apr. 17, 2012

(54) METAL GATE INTEGRATION STRUCTURE AND METHOD INCLUDING METAL FUSE, ANTI-FUSE AND/OR RESISTOR

(75) Inventors: Douglas D. Coolbaugh, Highland, NY (US); Ebenezer E. Eshun, Newburgh, NY (US); Ephrem G. Gebreselasie, South Burlington, VT (US); Zhong-Xiang He, Essex Junction, VT (US); Herbert Lei Ho, New Windsor, NY (US); Deok-kee Kim, Bedford Hills, NY (US); Chandrasekharan Kothandaraman, Hopewell Junction, NY (US); Dan Moy, Bethel, CT (US); Robert Mark Rassel, Colchester, VT (US); John Matthew Safran, Wappingers Falls, NY (US); Kenneth Jay Stein, Sandy Hook, CT (US); Norman Whitelaw Robson, Hopewell Junction, NY (US); Ping-Chuan Wang, Hopewell Junction, NY (US); Hongwen Yan, Somers, NY (US)

(73) Assignee: International Business Machines Corporation, Armonk, NY (US)

( * ) Notice: Subject to any disclaimer, the term of this patent is extended or adjusted under 35 U.S.C. 154(b) by 650 days.

(21) Appl. No.: 12/119,526

(22) Filed: May 13, 2008

(65) Prior Publication Data
US 2009/0283840 A1   Nov. 19, 2009

(51) Int. Cl.
*H01L 29/00* (2006.01)
(52) U.S. Cl. .................. 257/529; 257/530; 257/536
(58) Field of Classification Search .............. 257/529, 257/E23.149, 530, 536
See application file for complete search history.

(56) References Cited

U.S. PATENT DOCUMENTS

| | | |
|---|---|---|
| 5,182,225 A | 1/1993 | Matthews |
| 5,966,597 A | 10/1999 | Wright |
| 6,236,094 B1 | 5/2001 | Wright |
| 6,580,145 B2 | 6/2003 | Wu et al. |
| 6,852,167 B2 | 2/2005 | Ahn |
| 7,160,577 B2 | 1/2007 | Ahn et al. |
| 2007/0221959 A1 | 9/2007 | Zhu et al. |

OTHER PUBLICATIONS

Search report and written opinion of PCT/US09/041861.
Electromigration Characteristics of TiN Barrier Layer Material, Jiang Tao, et al. IEEE Electron Device Letters, vol. 16, No. 6, pp. 230-232, Jun. 1995.
A Novel Cu Electrical Fuse Structure and Blowing Scheme Utilizing Crack-assisted Mode for 90-45nm-node and Beyond, H.T. Ueda, et al., 2006 Symposium on VLSI Technology Digest of Technical Papers.

*Primary Examiner* — Michael Shingleton
(74) *Attorney, Agent, or Firm* — Scully, Scott, Murphy & Presser, P.C.; Yuanmin Cai

(57) ABSTRACT

A semiconductor structure and a method for fabricating the semiconductor structure provide a field effect device located and formed upon an active region of a semiconductor substrate and at least one of a fuse structure, an anti-fuse structure and a resistor structure located and formed at least in part simultaneously upon an isolation region laterally separated from the active region within the semiconductor substrate. The field effect device includes a gate dielectric comprising a high dielectric constant dielectric material and a gate electrode comprising a metal material. The at least one of the fuse structure, anti-fuse structure and resistor structure includes a pad dielectric comprising the same material as the gate dielectric, and optionally, also a fuse, anti-fuse or resistor that may comprise the same metal material as the gate electrode.

21 Claims, 5 Drawing Sheets

METAL GATE INTEGRATION STRUCTURE AND METHOD INCLUDING METAL FUSE, ANTI-FUSE AND/OR RESISTOR

BACKGROUND

1. Field of the Invention

The invention relates generally to semiconductor structures. More particularly, the invention relates to multi-component integration schemes within semiconductor structures.

2. Description of the Related Art

In addition to transistors, diodes and capacitors, semiconductor structures also often include fuses, anti-fuses and resistors. Fuses and anti-fuses within semiconductor circuits are often intended as option selecting devices. For example, such fuses or anti-fuses may be severed or fused (i.e., programmed) to provide for substitution of an inoperative portion of a semiconductor circuit with a redundant operative portion of the semiconductor circuit. In contrast, resistors within semiconductor structures are typically intended as load bearing elements or resonant frequency determining elements within semiconductor circuits.

While each of the foregoing electrical components is desirable and under certain circumstances essential within semiconductor circuits, nonetheless efficient fabrication of semiconductor structures that include a plurality of the foregoing electrical components is not entirely without problems. In particular, integration of multiple of the foregoing components into a single semiconductor structure often provides for design and manufacturing difficulties.

Various semiconductor structures and materials compositions having desirable properties, and methods for fabricating those semiconductor structures or using those materials compositions, are known in the semiconductor fabrication art.

For example, Tao, in "Electromigration Characteristics of TiN Barrier Layer Material," IEEE Electron Device Letters, Vol. 16(6), June 1995, teaches failure mechanism characteristics of titanium nitride as a barrier layer within multilayer metallization structures. In particular, Tao teaches an absence of electromigration as a failure mechanism for a titanium nitride barrier layer, and rather that electrical failure is due to a purely thermally activated process.

In addition, Ueda et al., in "A Novel Cu Electrical Fuse Structure and Blowing Scheme utilizing Crack-assisted Mode for 90-45 nm-node and beyond," IEEE 2006 Symposium on VLSI Technology Digest of Technical Papers, teaches a copper based e-fuse that uses a crack-assisted severing mode rather than an electromigration severing mode. Since the copper based e-fuse uses a material independent of a gate material, the copper based e-fuse is readily extendible to advanced generations of integrated circuits.

Further, Wright in U.S. Pat. Nos. 5,966,597 and 6,236,094 teaches a low resistance gate electrode within a semiconductor structure that results from partial replacement of a polysilicon gate electrode (i.e., replacement of an upper portion of the polysilicon gate electrode) with a metal within the semiconductor structure. The resultant metal capped polysilicon laminated gate electrode has improved electrical conductivity in comparison with a purely polysilicon gate electrode or a silicide capped polysilicon gate electrode.

Finally, Ahn in U.S. Pat. Nos. 6,852,167 and 7,160,577, teaches a chemical vapor deposition method, system and apparatus, that more specifically may include an atomic layer chemical vapor deposition method, system and apparatus, that in turn may be used for forming a layer such as but not limited to an aluminum oxide layer, within a semiconductor structure. The particular chemical vapor deposition method, system and apparatus, as taught, efficiently and economically provides the layer with enhanced uniformity.

Semiconductor device and semiconductor structure dimensions are certain to continue to decrease and semiconductor device and semiconductor structure integration levels are certain to increase, as semiconductor circuit functionality requirements increase. Thus, desirable are semiconductor structures, and methods for fabricating those semiconductor structures, that provide the semiconductor structures with enhanced integration of individual semiconductor device components, with enhanced manufacturability.

SUMMARY

The invention provides a semiconductor structure and a method for fabricating the semiconductor structure. The semiconductor structure includes at least one of a fuse structure, an anti-fuse structure and a resistor structure integrated with a field effect device, such as but not limited to a field effect transistor, within the semiconductor structure. Within the semiconductor structure and the method, a pad dielectric (i.e., a dielectric layer upon which is located a fuse, an anti-fuse or a resistor) within the fuse structure, the anti-fuse structure or the resistor structure comprises the same higher dielectric constant dielectric material (i.e., having a dielectric constant greater than about 10 and more preferably greater than about 20) as a gate dielectric within the field effect device. In addition, a fuse within the fuse structure, an anti-fuse within the anti-fuse structure or a resistor within the resistor structure may comprise the same metal material as a metal gate within the field effect transistor. The method for fabricating the foregoing semiconductor structure provides that a gate stack (i.e., comprising at least the foregoing higher dielectric constant gate dielectric material and the foregoing metal gate) may be fabricated simultaneously with the at least one of the fuse structure, the anti-fuse structure and the resistor structure.

A particular semiconductor structure in accordance with the invention includes a semiconductor substrate that includes an active region laterally adjacent an isolation region. This particular semiconductor structure also includes a field effect device located within the active region. The field effect device includes: (1) a gate dielectric located upon the active region and comprising a gate dielectric material having a dielectric constant greater than about 10; and (2) a gate electrode located upon the gate dielectric and comprising a metal material. This particular semiconductor structure also includes at least one of a fuse structure, an anti-fuse structure and a resistor structure located over the isolation region. The at least one of the fuse structure, the anti-fuse structure and the resistor structure includes: (1) a pad dielectric located upon the isolation region and comprising at least in-part the same gate dielectric material as the gate dielectric; and (2) at least one of a fuse, an anti-fuse and a resistor located upon the pad dielectric.

A particular method in accordance with the invention includes providing a semiconductor substrate that includes an active region laterally adjacent an isolation region. This particular method also includes forming upon the active region and the isolation region a gate dielectric material layer comprising a gate dielectric material having a dielectric constant greater than about 10. This particular method also includes forming upon the gate dielectric material layer over the active region and the isolation region a metal gate material layer comprising a metal material. This particular method also includes patterning the metal gate material layer and the gate dielectric material layer to simultaneously form: (1) a gate electrode comprising the metal material upon a gate dielectric comprising the gate dielectric material upon the active region; and (2) at least one of a fuse, an anti-fuse and a resistor comprising the metal material upon a pad dielectric comprising the gate dielectric material upon the isolation region.

Another particular method in accordance with the invention includes providing a semiconductor substrate that includes an active region laterally adjacent an isolation region. This other particular method also includes forming upon the active region and the isolation region a gate dielectric material layer comprising a gate dielectric material having a dielectric constant greater than about 10. This other particular method also includes forming upon the gate dielectric material layer over the active region a metal gate material layer comprising a metal material. This other particular method also includes forming upon the gate dielectric material layer over the isolation region a metal gate capping layer comprising a polysilicon material. This other particular method also includes patterning the metal gate material layer, the metal gate capping layer and the gate dielectric material layer to simultaneously form: (1) a gate electrode comprising the metal material upon a gate dielectric comprising the gate dielectric material upon the active region; and (2) at least one of a fuse, an anti-fuse and a resistor comprising the polysilicon material upon a pad dielectric comprising the gate dielectric material upon the isolation region.

Yet another particular method in accordance with the invention includes providing a semiconductor substrate that includes an active region laterally adjacent an isolation region. This other method also includes forming upon the active region and the isolation region a gate dielectric material layer comprising a gate dielectric material having a dielectric constant greater than about 10. This other method also includes forming upon the gate dielectric material layer over the active region and the isolation region a metal gate material layer comprising a metal material. This other method also includes forming upon the metal gate material layer over the active region and the isolation region a metal gate capping layer comprising a polysilicon material. This other method also includes patterning the metal gate capping layer, the metal gate material layer and the gate dielectric material layer to simultaneously form: (1) a gate electrode comprising the polysilicon material upon the metal material upon a gate dielectric comprising the gate dielectric material upon the active region; and (2) at least one of a fuse, an anti-fuse and a resistor comprising the polysilicon material upon the metal material upon a pad dielectric comprising the gate dielectric material upon the isolation region.

BRIEF DESCRIPTION OF THE DRAWINGS

The objects, features and advantages of the invention are understood within the context of eth Description of Preferred Embodiments as set forth below. The Description of the Preferred Embodiments is understood within the context of the accompanying drawings, that form a material part of this disclosure, wherein.

DESCRIPTION OF THE PREFERRED EMBODIMENTS

The invention, which includes a semiconductor structure and a method for fabricating the semiconductor structure, is understood within the context of the description set forth below. The description set forth below is understood within the context of the drawings described above. Since the drawings are intended for illustrative purposes, the drawings are not necessarily drawn to scale.

Figure 1:
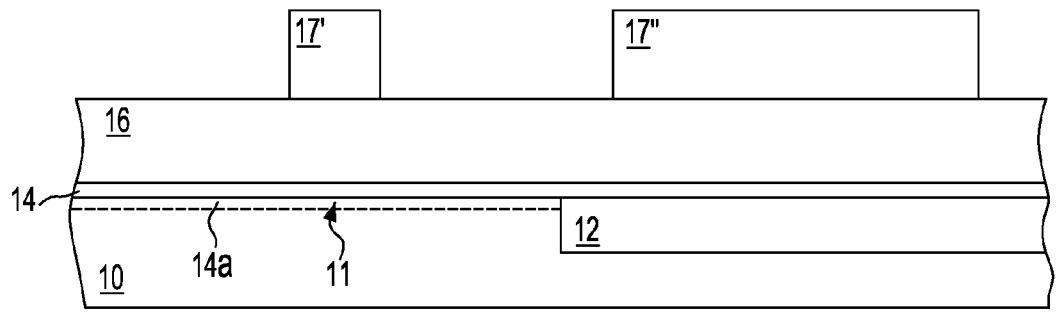
FIG. 1 to FIG. 4 show a series of schematic cross-sectional diagrams illustrating the results of progressive stages in fabricating a semiconductor structure in accordance with a particular embodiment of the invention.

FIG. 1 to FIG. 4 show a series of schematic cross-sectional diagrams illustrating the results of progressive stages in fabricating a semiconductor structure in accordance with a particular embodiment of the invention. This particular embodiment of the invention comprises a first embodiment of the invention, within the context of several additional embodiments of the invention that follow. FIG. 1 shows a schematic cross-sectional diagram illustrating the semiconductor structure at an early stage in the fabrication thereof in accordance with this particular first embodiment.

FIG. 1 shows a semiconductor substrate 10. An isolation region 12 is located and formed partially embedded within the semiconductor substrate 10 so that an active region 11 of the semiconductor substrate 10 and a top surface of the isolation region 12 are nominally coplanar. A gate dielectric material layer 14 is located and formed upon exposed portions of the semiconductor substrate 10 (i.e., the active region 11) and the isolation region 12. A metal gate material layer 16 is located and formed upon the gate dielectric material layer 14. A plurality of first mask layers 17' and 17" is located and formed upon the metal gate material layer 16, with the first mask layer 17' nominally centered above the active region 11 and the first mask layer 17" nominally centered above the isolation region 12.

Each of the foregoing semiconductor substrate 10, and regions and layers located therein, thereupon and/or thereover, may comprise materials, have dimensions and be formed using methods, that are otherwise generally conventional in the semiconductor fabrication art.

The semiconductor substrate 10 may comprise any of several semiconductor materials. Non-limiting examples include silicon, germanium, silicon-germanium alloy, silicon-carbon alloy, silicon-germanium-carbon alloy and compound (i.e., III-V and II-VI) semiconductor materials. Non-limiting examples of compound semiconductor materials include gallium arsenide, indium arsenide and indium phosphide semiconductor materials. As discussed in further detail below, the semiconductor substrate may comprise a bulk semiconductor substrate, a semiconductor-on-insulator (SOI) substrate or a hybrid orientation (HOT) substrate.

The isolation region 12 may comprise any of several dielectric isolation materials. Non-limiting examples include oxides, nitrides and oxynitrides, particularly of silicon. However, oxides, nitrides and oxynitrides of other elements are not excluded. The isolation region 12 may comprise a crystalline dielectric material or a non-crystalline dielectric material, with crystalline dielectric materials generally being preferred. The isolation region 12 may be formed using any of several methods. Non-limiting examples include ion implantation oxidation or nitridation methods, thermal or plasma oxidation or nitridation methods, chemical vapor deposition methods and physical vapor deposition methods. Typically, the isolation region 12 comprises at least in-part an oxide of the semiconductor material from which is comprised the semiconductor substrate 10. Typically, the isolation region 12 has a depth within the semiconductor substrate from about 20 to about 100 nanometers.

Within the context of this particular embodiment and additional embodiments that follow, the gate dielectric material layer 14 comprises a generally higher dielectric constant dielectric material having a dielectric constant greater than about 10 (alternatively 10 or greater). Further alternatively, the dielectric constant may be from about 20 (or at least about 20, or greater than 20) to at least about 100 (more preferably at least about 30 to at least about 100 and still more preferably at least 50 to at least about 100). Such higher dielectric constant dielectric materials may include, but are not necessarily limited to hafnium oxides, hafnium silicates, titanium oxides, barium-strontium-titantates (BSTs) and lead-zirconate-titanates (PZTs). The gate dielectric material layer 14 may be formed using any of several methods that are appropriate to the material of composition of the gate dielectric material layer 14. Non-limiting examples of such methods include thermal or plasma oxidation or nitridation methods, chemical vapor deposition methods and physical vapor deposition methods. Typically, the gate dielectric material layer 14 comprises a higher dielectric constant dielectric material, such as but not limited to a hafnium oxide dielectric material or a hafnium silicate dielectric material, that has a thickness from about 1 to about 10 nanometers.

As is understood by a person skilled in the art, the surface of the active region 11 will typically include a thermal dielectric layer 14a as is illustrated in phantom within FIG. 1 (i.e., an oxide, a nitride or an oxynitride) located thereupon and formed to a thickness from about 0.5 to about 2 nanometers. Such a thermal dielectric layer may be considered as a part of the active region 11 of the semiconductor substrate 10 within the invention as claimed. Such a thermal dielectric layer 14a is not formed upon the isolation region 12.

The metal gate material layer 16 may comprise any of certain metals, metal alloys and metal nitrides, but not metal suicides, as well as laminates and composites of the certain metals, metal alloys and metal nitrides. A particular metal, metal alloy or metal nitride from which may be comprised the metal gate material layer 16 is often selected within the context of a work function of a gate electrode subsequently patterned at least in-part from the metal gate material layer 16. Particularly common metals, metal alloys and metal nitrides from which may be comprised the metal gate material layer 16 include titanium, tungsten, tantalum, vanadium and platinum metals, metal alloys and metal nitrides. The foregoing metals, metal alloys and metal nitrides may also be formed using any of several methods. Non-limiting examples include chemical vapor deposition methods and physical vapor deposition methods, such as, but not limited to evaporative methods and sputtering methods. Also included, and also not limiting, are thermal or plasma nitridation methods. Typically, the metal gate material layer 16 comprises a titanium, tungsten or tantalum metal, metal alloy or metal nitride that has a thickness from about 50 to about 120 nanometers.

The first mask layers 17' and 17" may comprise any of several mask materials. Included in particular are hard mask materials and/or resist mask materials. Resist mask materials are generally more common and photoresist mask materials are still even more common although the use of neither of the foregoing resist mask materials is intended to limit the embodiment or the invention. More specifically, resist materials may include, but are not necessarily limited to positive resist materials, negative resist materials and hybrid resist materials that include properties of both positive resist materials and negative resist materials. Typically, the first mask layers 17' and 17" comprise a positive resist material or a negative resist material that has a thickness from about 150 to about 600 nanometers. Finally, as is discussed above, the first mask layer 17' is located and formed nominally centered above the active region 11 of the semiconductor substrate 10 and the first mask layer 17" is located and formed nominally centered above the isolation region 12.

Although FIG. 1 illustrates a semiconductor structure in accordance with the particular first embodiment as fabricated using a bulk semiconductor substrate for the semiconductor substrate 10, neither the first embodiment, nor any of the subsequent embodiments, is necessarily intended to be so limited. Rather the first embodiment, as well as subsequent embodiments that are described below, contemplate as an alternative to a bulk semiconductor substrate for the semiconductor substrate 10, the use of a semiconductor-on-insulator (SOI) substrate or a hybrid orientation (HOT) substrate.

A semiconductor-on-insulator substrate would include a base semiconductor substrate separated from a surface semiconductor layer by a buried dielectric layer. Within the context of the first embodiment as illustrated in FIG. 1, such a buried dielectric layer would typically, but not necessarily, contact the isolation region 12. As is understood by a person skilled in the art, a hybrid orientation substrate includes multiple semiconductor regions of different crystallographic orientation supported upon a single substrate.

Within the context of any one of a bulk semiconductor substrate, a semiconductor-on-insulator substrate or a hybrid orientation substrate, this particular embodiment, and additional particular embodiments that follow, filter contemplate layers and structures that are not necessarily shown, but that would nonetheless introduce a mechanical stress into the active region 11. Such a mechanical stress may be a positive mechanical stress or a negative mechanical stress, as is determined to be advantageous within the context of a polarity of a field effect device, and in particular a field effect transistor, intended to be subsequently located and formed within the active region 11, as is illustrated within the context of further description below.

Figure 2:
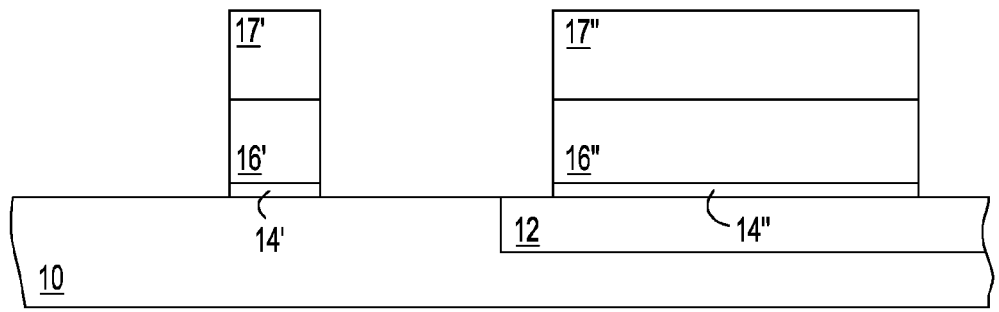

FIG. 2 shows the results of sequentially patterning the metal gate material layer 16 and the gate dielectric material layer 14 to simultaneously form: (1) a gate electrode 16' located upon a gate dielectric 14' located upon a channel region within the active region 11 of the semiconductor substrate 10 while using the first mask layer 17' as an etch mask; and (2) a fuse/resistor 16" located upon a pad dielectric 14" in turn located upon the isolation region 12 while using the first mask layer 17" as an etch mask.

The foregoing sequential patterning of: (1) the metal gate material layer 16 to form the gate electrode 16' and the fuse/resistor 16"; and (2) the gate dielectric material layer 14 to form the gate dielectric 14' and the pad dielectric 14" may be effected using etch methods and etch materials that are otherwise generally conventional in the semiconductor fabrication art. Included in particular are wet chemical etch methods, dry plasma etch methods and combinations of wet chemical etch methods and dry plasma etch methods. Dry plasma etch methods are considerably more common insofar as dry plasma etch methods provide for generally straight sidewalls to the gate electrode 16', the fuse/resistor 16", the gate dielectric 14' and the pad dielectric 14". Particular dry plasma etch methods use an etchant gas composition, or a series of etchant gas compositions, that is appropriate to the materials from which are comprised the metal gate material layer 16 and the gate dielectric material layer 14.

Figure 3:
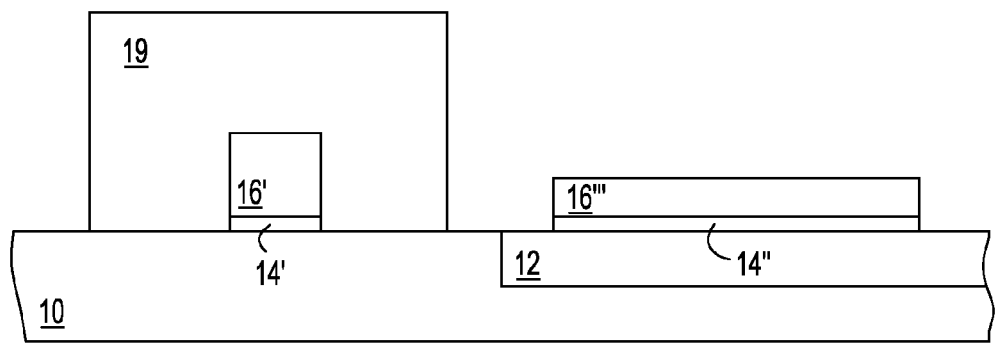

FIG. 3 first shows the results of stripping the first mask layer 17' and the first mask layer 17" from the gate electrode 16' and the fuse/resistor 16" that are illustrated in FIG. 2. The first mask layer 17' and the first mask layer 17" may be stripped using methods and materials that are generally conventional in the semiconductor fabrication art. Included in particular are wet chemical etch methods, dry plasma etch methods and combinations of wet chemical etch methods and dry plasma etch methods.

FIG. 3 next shows the results of masking the gate electrode 16' and the gate dielectric 14' while using a second mask layer 19. The second mask layer 19 may comprise materials and be formed using methods analogous, equivalent or identical to the materials and methods used for forming the first mask layer 17' and the first mask layer 17" that are illustrated in FIG. 1, but nonetheless formed in a fashion such as to straddle the gate stack that comprises the gate electrode 16' and the gate dielectric 14'.

FIG. 3 finally shows the results of thinning the fuse/resistor 16" that is illustrated in FIG. 2 to form a fuse/resistor 16'''. The foregoing thinning is effected by etching the fuse/resistor 16" while using etch methods and etch materials analogous, equivalent or identical to the etch methods and etch materials that are initially used for etching the gate electrode 16' and the fuse/resistor 16" from the metal gate material layer 16 initially as illustrated within the context of FIG. 1 and FIG. 2. Typically, the fuse/resistor 16''' is thinned to a thickness from about 20 to about 50 nanometers.

Figure 4:
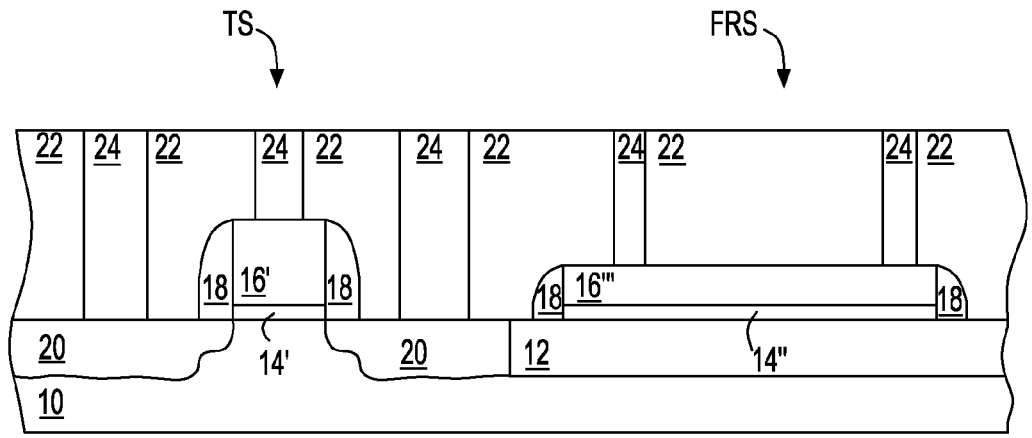

FIG. 4 first shows the results of stripping the second mask layer 19 from the semiconductor structure of FIG. 3. The second mask layer 19 may be stripped using methods and materials analogous, equivalent or identical to the methods and materials used for stripping the first mask layer 17' and the first mask layer 17" from the semiconductor structure of FIG. 2 when forming the semiconductor structure of FIG. 3.

FIG. 4 next shows a plurality of spacers 18 located adjacent and adjoining the materials stacks that include the gate electrode 16' and the gate dielectric 14', or the fuse/resistor 16''' and the pad dielectric 14". The spacers 18, while illustrated as plural layers with respect to each of the foregoing materials stacks, are actually intended as completely encircling of the individual materials stacks in plan view.

The spacers 18 may comprise materials including, but not limited to conductor materials and dielectric materials. Conductor spacer materials are less common, but are nonetheless known. Dielectric spacer materials are more common. Dielectric spacer materials may be formed using methods analogous, equivalent or identical to the methods that are used for forming the isolation region 12. The spacers 18 are also formed with the distinctive inward pointing spacer shape by using a blanket layer deposition and anisotropic etchback method. Typically, the spacers 18 comprise at least in-part a silicon oxide dielectric material.

FIG. 4 also shows a plurality of source and drain regions 20 located and formed within the active region of the semiconductor substrate 10 and separated by the gate electrode 16' and the gate dielectric 14'. The plurality of source and drain regions 20 comprises a dopant appropriate to a polarity of a field effect transistor desired to be fabricated. As is understood by a person skilled in the art, the plurality of source and drain regions 20 is formed using a two-step ion implantation method. A first ion implantation process step within the method uses the gate electrode 16', absent the spacer 18, as a mask to form a plurality of extension regions, each of which extends beneath the spacer 18. A second ion implantation process step uses the gate electrode 16' and the spacer 18 as a mask to form the larger contact region portions of the plurality of source and drain regions 20, while simultaneously incorporating the plurality of extension regions. Extension regions within the plurality of source and drain regions 20 may under certain circumstances be more lightly doped than contact regions with the plurality of source and drain regions 20, although such differential doping concentrations are not a requirement of the embodiment.

FIG. 4 finally shows a passivation layer 22 passivating a resulting transistor structure TS and a resulting fuse/resistor structure FRS that are designated within the schematic cross-sectional diagram of FIG. 4. FIG. 4 also shows penetrating through the passivation layer 22 a plurality of contact vias 24 that contact the source and drain regions 20, the gate electrode 16', and opposite ends of the fuse/resistor 16'''.

The passivation layer 24 may comprise materials and be formed using methods that are analogous, equivalent or identical to the materials and methods that are used to form the isolation region 12. Typically, the passivation layer 22 comprises at least in-part a silicon oxide material. Typically, the passivation layer has a thickness from about 250 to about 600 nanometers.

The plurality of contact vias 24 may comprise materials including, but not limited to certain metals, metal alloys, metal nitrides and metal suicides, as well as laminates thereof and composites thereof. The plurality of contact vias 24 may also comprise doped polysilicon and polysilicon-germanium alloy materials (i.e., having a dopant concentration from about 1e18 to about 1e22 dopant atoms per cubic centimeter) and polycide materials (doped polysilicon (or polysilicon-germanium alloy)/metal silicide stack materials). Similarly, the foregoing materials may also be formed using any of several methods. Non-limiting examples include salicide methods, chemical vapor deposition methods and physical vapor deposition methods, such as, but not limited to evaporative methods and sputtering methods. Typically, the plurality of contact vias 24 comprises a tungsten contact stud material that has a thickness from about 200 to about 400 nanometers, that correlates with a thickness of the passivation layer 22.

FIG. 4 shows a schematic cross-sectional diagram of a semiconductor structure in accordance with a particular embodiment of the invention that comprises the first embodiment of the invention. The semiconductor structure includes a transistor structure TS integrated with and formed simultaneously with a fuse/resistor structure FRS. The transistor structure TS includes a gate dielectric 14' that comprises a comparatively high dielectric constant gate dielectric material and a gate electrode 16' located thereupon that comprises a metal gate material. The fuse/resistor structure FRS includes a pad dielectric 14" that comprises the same comparatively high dielectric constant dielectric material as the gate dielectric 14'. The fuse/resistor structure FRS also includes a fuse/resistor 16''' that comprises the same metal material as the gate electrode 16'. Within the semiconductor structure in accordance with the particular first embodiment that is illustrated in FIG. 1, the fuse/resistor 16''' may preferably, but need not necessarily, have a thickness less than the gate electrode 16', due to thinning of the fuse/resistor 16''' in comparison with the fuse/resistor 16" that is formed simultaneously with the gate electrode 16'. The semiconductor structure of FIG. 1 thus provides a transistor structure TS that is efficiently and simultaneously integrated with a fuse/resistor structure FRS within a semiconductor structure.

For reference purposes within the context of FIG. 1 to FIG. 4, a typical fuse/resistor 16" thickness in accordance with above disclosure may be about 100 nanometers. Assuming a titanium nitride fuse/resistor 16" with an electromigration current constant of about 600 milliamps per square micron and a fuse/resistor 16" width of about 50 nanometers, an electromigration current will be about 3 milliamps. For a thinner titanium nitride fuse/resistor 16''' of 50 nanometers, an electromigration current will be about 1.5 milliamps. Typical e-fusing electromigration current operational requirements will be about three times the foregoing electromigration currents. In general, within the context of the thinner fuse/resistor 16''' lower electromigration currents are feasible where needed. In turn, these lower electromigration currents allow for smaller driver field effect transistors (FETs). Thus, a narrower wiring and a higher density may be realized in a fuse resistor structure FRS in accordance with the invention, in general.

Figure 5:
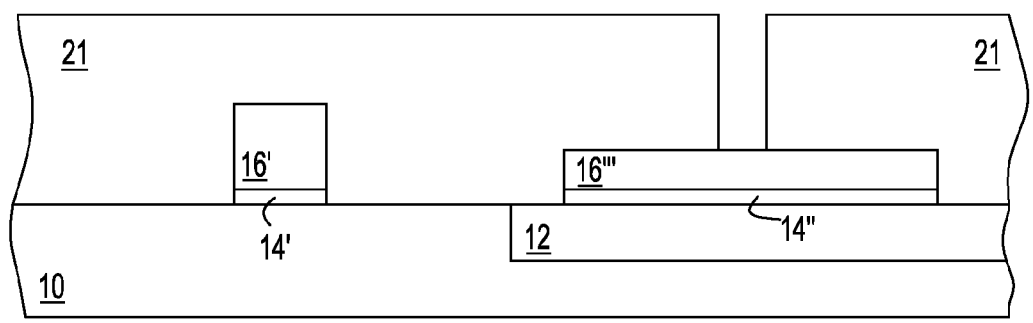
FIG. 5 to FIG. 6 show a series of schematic cross-sectional diagrams illustrating the results of progressive stages in fabricating a semiconductor structure in accordance with another particular embodiment of the invention
Figure 6:
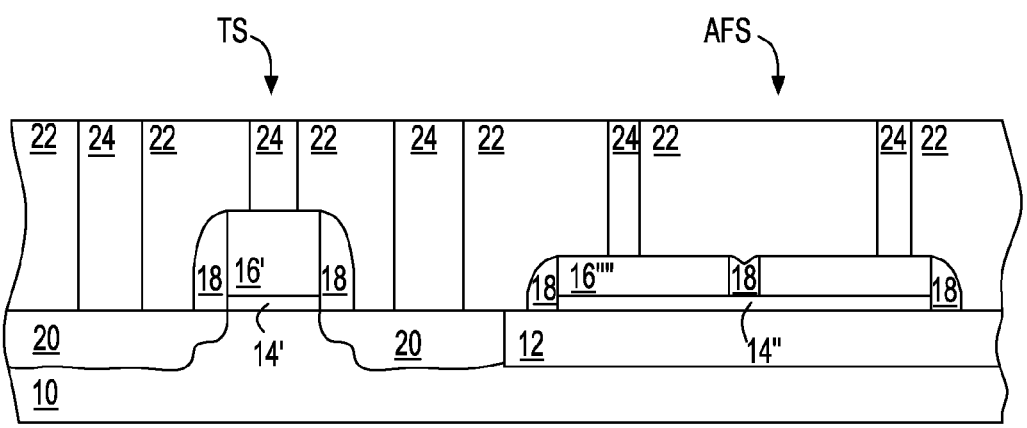

FIG. 5 and FIG. 6 show a series of schematic cross-sectional diagram illustrating the results of progressive stages in fabricating a semiconductor structure in accordance with another particular embodiment of the invention. This other particular embodiment of the invention comprises a second embodiment of the invention.

This other particular second embodiment of the invention derives from the first embodiment of the invention, and also derives from the process steps that are illustrated in FIG. 1, FIG. 2 and FIG. 3. However, after stripping the second mask layer 19 from the gate electrode 16' and the gate dielectric 14' that is illustrated in FIG. 3, a third mask layer 21 is located and formed covering the semiconductor structure, to provide the semiconductor structure whose schematic cross-sectional diagram is illustrated in FIG. 5. As is illustrated within the schematic cross-sectional diagram of FIG. 5, the third mask layer 21 leaves exposed a nominally central portion of the fuse/resistor 16'''.

FIG. 6 first shows the results of patterning the fuse/resistor 16''' that is illustrated in FIG. 5 to form a plurality of anti-fuse plates 16'''', while using the third mask layer 21 as an etch mask. The foregoing patterning may be effected using etch methods and etch materials analogous, equivalent or identical to the etch methods and etch materials that are used for forming the fuse/resistor 16" that is illustrated in FIG. 2 from the metal gate material layer 16 that is illustrated in FIG. 1 or the fuse/resistor 16''' that is illustrated in FIG. 3 from the fuse/resistor 16" that is illustrated in FIG. 2.

FIG. 6 otherwise illustrates the results of semiconductor processing that is analogous, equivalent or identical to the semiconductor processing that provides the semiconductor structure of FIG. 4, but wherein a gap interposed between the plurality of anti-fuse plates 16'''' is filled with a spacer 18 that serves as an anti-fuse dielectric. FIG. 6 thus shows a semiconductor structure that includes a transistor structure TS and an anti-fuse structure AFS rather than a fuse/resistor structure FRS.

FIG. 6 shows a schematic cross-sectional diagram of a semiconductor structure in accordance with a second embodiment of the invention. The semiconductor structure in accordance with this second embodiment of the invention is analogous to the semiconductor structure whose schematic cross-sectional diagram is illustrated in FIG. 4, but includes an anti-fuse structure AFS that includes the plurality of anti-fuse plates 16'''', a particular spacer 18 (i.e., that is intended as an anti-fuse dielectric) and the pad dielectric 14" rather than the fuse/resistor 16''' and the pad dielectric 14".

Figure 7:
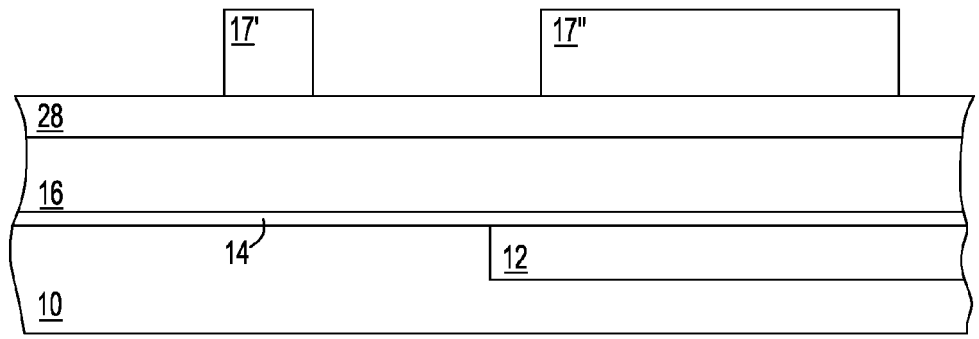
FIG. 7 to FIG. 9 show a series of schematic cross-sectional diagrams illustrating the results of progressive stages in fabricating a semiconductor structure in accordance with yet another particular embodiment of the invention
Figure 8:
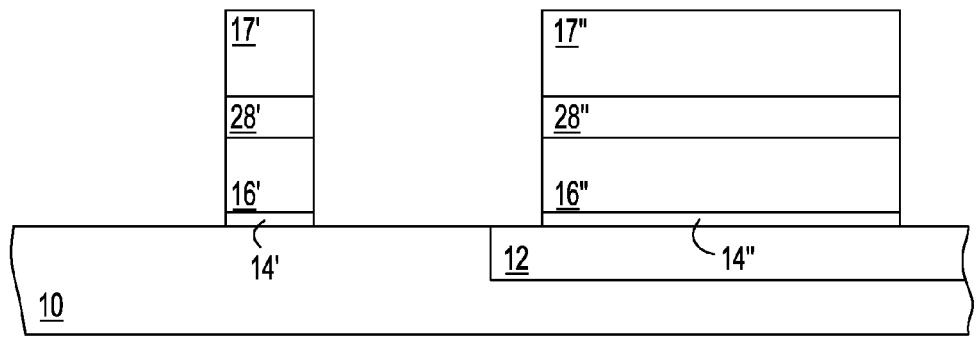
Figure 9:
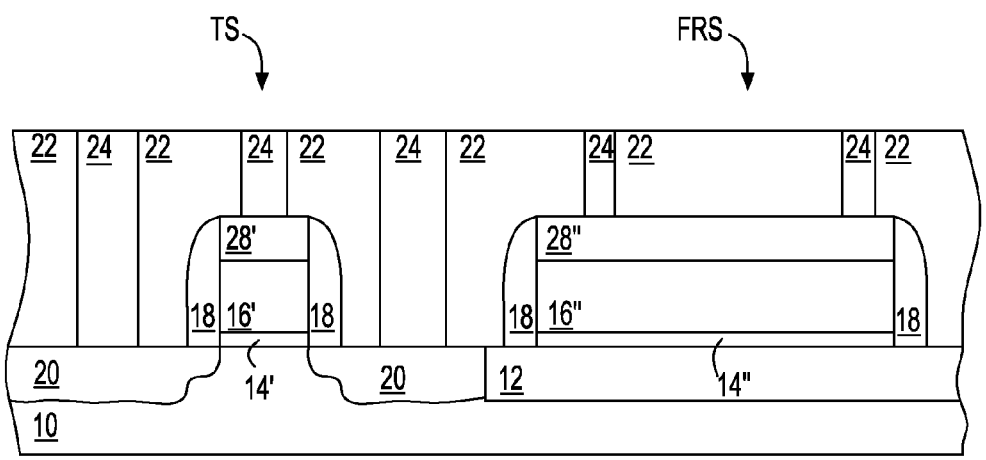

FIG. 7 to FIG. 9 show a series of schematic cross-sectional diagrams illustrating the results of progressive stages in fabricating a semiconductor structure in accordance with yet another embodiment of the invention. This particular other embodiment of the invention comprises a third embodiment of the invention.

FIG. 7 corresponds generally with FIG. 1, but includes in addition to the metal gate material layer 16 (i.e., that now may have a lesser initial thickness in a range from about 20 to about 50 nanometers), the additional presence of a metal gate capping layer 28. The metal gate capping layer 28 may comprise any of several metal gate capping materials. Such metal gate capping materials are typically intended as conductor materials. Included in particular for the metal gate capping materials, but also not limiting, are functionally adequately conductively doped polysilicon metal gate capping materials. The foregoing metal gate capping materials may be formed using methods including but not limited to chemical vapor deposition methods and physical vapor deposition methods. Typically, the metal gate capping layer 28 comprises a doped polysilicon metal gate capping material that has a thickness from about 100 to about 400 nanometers.

FIG. 8 corresponds with FIG. 2, but with the additional patterning of the metal gate capping layer 28 to form a gate electrode cap 28' that is located upon the gate electrode 16' and a fuse/resistor cap 28" that is located upon the fuse/resistor 16".

FIG. 9 corresponds generally with FIG. 4, but where: (1) a gate stack within the transistor structure TS comprises the gate electrode cap 28', the gate electrode 16' and the gate dielectric 14' rather than only the gate electrode 16' and the gate dielectric 14'; and (2) the fuse/resistor structure FRS comprises the fuse/resistor cap 28", the fuse/resistor 16" and the pad dielectric 14" rather than only the fuse/resistor 16" and the pad dielectric 14". But for these additional layers, the semiconductor structure of FIG. 9 possesses all of the advantages and features of the semiconductor structure of FIG. 4.

Figure 10:
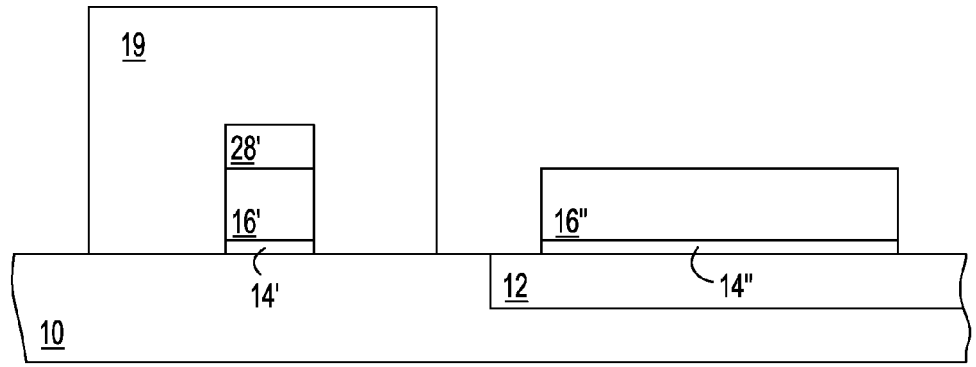
FIG. 10 to FIG. 11 show a series of schematic cross-sectional diagrams illustrating the results of progressive stages in fabricating a semiconductor structure in accordance with still yet another embodiment of the invention
Figure 11:
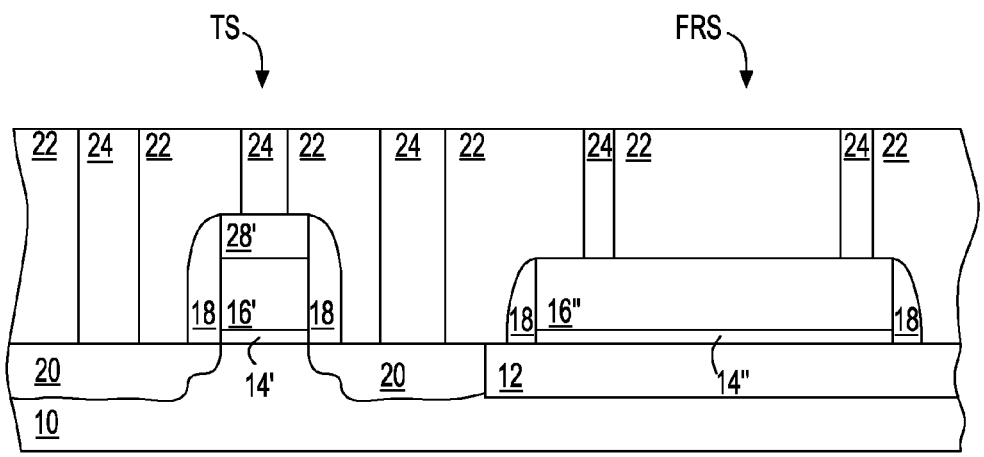

FIG. 10 and FIG. 11 show a plurality of schematic cross-sectional diagrams illustrating the results of progressive stages in fabricating a semiconductor structure in accordance with still yet another embodiment of the invention. This other embodiment of the invention comprises a fourth embodiment of the invention.

As a starting point, FIG. 10 shows the results of further processing of the semiconductor structure of FIG. 8. FIG. 10 first shows the results of stripping the first mask layer 17' and the first mask layer 17" from the semiconductor structure of FIG. 8. FIG. 10 also shows a second mask layer 19 that is otherwise analogous, equivalent or identical to the second mask layer 19 that is illustrated in FIG. 3, but covers the gate electrode cap 28' and the gate electrode 16' rather than the gate electrode 16'. As is illustrated within the schematic cross-sectional diagram of FIG. 10, the fuse/resistor cap 28" is stripped from the fuse/resistor 16" while using the third mask layer 19 as an etch mask.

FIG. 11 shows a schematic cross-sectional diagram that corresponds with the semiconductor processing that yields the semiconductor structure of FIG. 4, but wherein a gate stack within the transistor structure TS includes the gate electrode cap 28', the gate electrode 16' and the gate dielectric 14' rather than only the gate electrode 16' and the gate dielectric 14'. The semiconductor structure of FIG. 11 otherwise also possesses all of the advantages and features of the semiconductor structure of FIG. 4.

Figure 12:
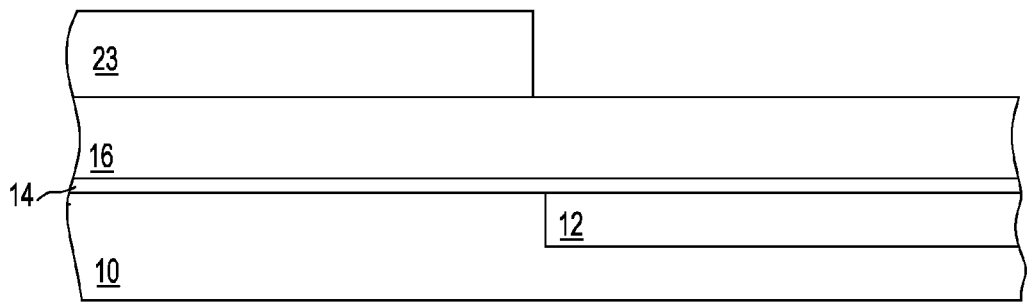
FIG. 12 to FIG. 14 show a series of schematic cross-sectional diagrams illustrating the results of progressive stages in fabricating a semiconductor structure on accordance with yet still another embodiment of the invention.
Figure 13:
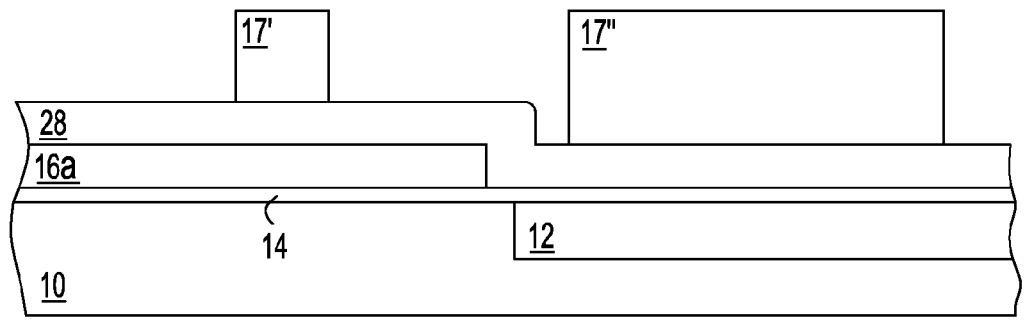
Figure 14:
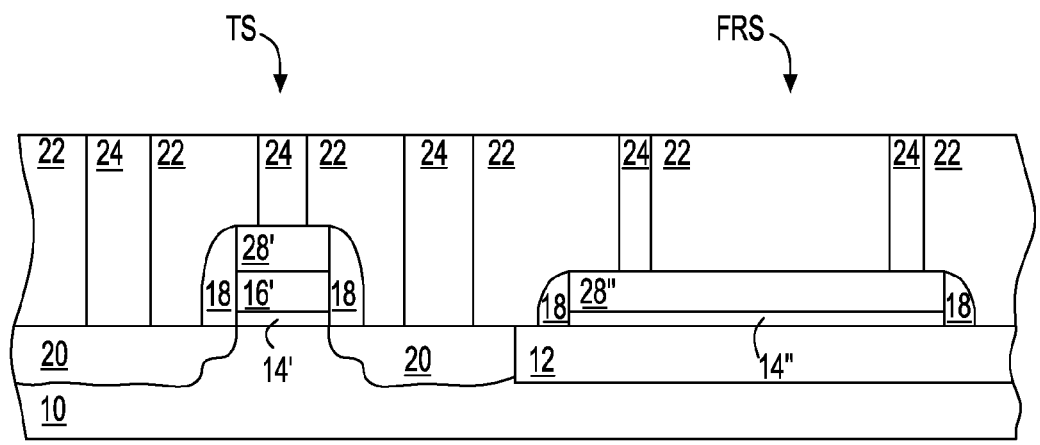

FIG. 12 to FIG. 14 show a series of schematic cross-sectional diagrams illustrating the results of progressive stages in fabricating a semiconductor structure in accordance with yet still another preferred embodiment of the invention. This other embodiment of the invention comprises a fifth and final embodiment of the invention. FIG. 12 shows a schematic cross-sectional diagram of the semiconductor structure at an early stage in the fabrication thereof in accordance with this fifth and presently final embodiment.

FIG. 12 shows a schematic cross-sectional diagram of a semiconductor structure otherwise analogous to the semiconductor structure whose schematic cross-sectional diagram is illustrated in FIG. 1, but with a thinner metal gate material layer 16 typically in a thickness range from about 20 to about 50 nanometers. FIG. 12 also shows a fourth mask layer 23 located and formed upon a portion of the metal gate material layer 16 that covers the active region of the semiconductor substrate 10.

The fourth mask layer 23 may comprise materials and be formed using methods that are analogous, equivalent or identical to the materials and methods that are used for forming the third mask layer 21 that is illustrated in FIG. 5, the second mask layer 19 that is illustrated in FIG. 3 or the first mask layer 17 that is illustrated in FIG. 1, but being dimensioned to cover the active region of the semiconductor substrate 10 that is illustrated in FIG. 12.

FIG. 13 first shows the results of patterning the metal gate material layer 16 to form a metal gate material layer 16a while using the fourth mask 21 as an etch mask. The foregoing etching and patterning to form the metal gate material layer 16a from the metal gate material layer 16 is otherwise analogous, equivalent or identical to the etching and patterning that is used for forming the gate electrode 16' that is illustrated in FIG. 2 from the metal gate material layer 16 that is illustrated in FIG. 1. Subsequent to etching the gate electrode material layer 16 to form the gate electrode material layer 16a, the fourth mask layer is stripped from the intermediate resulting semiconductor structure. Such stripping is effected using methods and materials analogous, equivalent or identical to the methods and materials that are used for stripping the third mask layer 21, the second mask layer 19 or the first mask layer 17, as previously described.

FIG. 13 also shows a gate electrode capping layer 28 located and formed upon the exposed portions of the metal gate material layer 16a and the gate dielectric material layer 14. FIG. 13 finally shows the first mask layer 17' and the first mask layer 17" located upon the gate electrode capping layer 28. The gate electrode capping layer 28 corresponds with the gate electrode capping layer 28 that is illustrated in FIG. 7. The first mask layer 17' and the first mask layer 17" correspond with the first mask layer 17' and the first mask layer 17" that are illustrated in FIG. 1. The semiconductor structure of FIG. 13 otherwise corresponds with the semiconductor structure of FIG. 7, but with the metal gate material layer 16a covering only the active region of the semiconductor substrate 10 and not the isolation region 12, in comparison with the metal gate material layer 16.

FIG. 14 shows tie results of further processing of the semiconductor structure of FIG. 13. FIG. 14 first shows the results of patterning the gate electrode capping layer 28 and the metal gate material layer 16a and the gate dielectric material layer 14 to form: (1) a gate stack within a transistor structure TS that comprises a gate dielectric 14', a gate electrode 16' and a gate electrode cap 28'; and (2) a fuse/resistor structure FRS that comprises a fuse/resistor cap 28"and a pad dielectric 14" absent an intervening fuse/resistor derived from the metal gate material layer 16 that is illustrated in FIG. 12. The foregoing patterning and etching may be effected using methods and materials as previously described.

Although not particularly illustrated within the schematic cross-sectional diagram of FIG. 14, the fuse/resistor structure FRS will typically include a silicide layer located upon the fuse/resistor cap 28" when the fuse/resistor cap 28" functions as a fuse. Such a silicide layer may or may not be present when the fuse/resistor cap 28" functions as a resistor. Such a silicide layer may comprise any of several silicide forming metals, such as but not limited to nickel, cobalt, titanium, tungsten and platinum silicide having a thickness from about 10 to about 50 nanometers.

The remaining processing that provides the semiconductor structure of FIG. 14 from the semiconductor structure of FIG. 13 is analogous, equivalent or identical to semiconductor processing that is used for forming the semiconductor structure of FIG. 4 from the semiconductor structure of FIG. 3.

FIG. 14 shows a semiconductor structure that includes within a gate electrode stack within a transistor structure TS a gate electrode cap 28' located upon a gate electrode 16' in turn located upon a gate dielectric 14'. The semiconductor structure also includes a fuse/resistor structure FRS that includes a fuse/resistor cap 28" located upon a pad dielectric 14". The fuse/resistor cap 28" comprises a polysilicon material and absent within the fuse/resistor structure FRS is a metal gate material.

Similarly with other embodiments of the invention, this particular fifth and presently final embodiment possesses the same desirable characteristics with respect to simultaneous fabrication of a transistor structure TS and a fuse/resistor structure FRS.

The preferred embodiments are illustrative of the invention rather than limiting of the invention. Revisions and modifications may be made to methods, materials, structures and dimensions of the semiconductor structures in accordance with the various embodiments while still providing a semiconductor structure and a method for fabrication thereof in accordance with the invention, further in accordance with the accompanying claims.

What is claimed is:

1. A semiconductor structure comprising:
   a semiconductor substrate that includes an active region laterally adjacent an isolation region, wherein the isolation region has an upper surface that is co-planar with an upper surface of the semiconductor substrate;
   a field effect device located within the active region, the field effect device comprising:
      a gate dielectric located upon the active region and comprising a gate dielectric material having a dielectric constant greater than about 10; and
      a gate electrode located upon the gate dielectric and comprising a metal material, wherein said gate dielectric has sidewalls that are vertically coincident with sidewalls of said gate electrode; and
   at least one of a fuse structure, an anti-fuse structure and a resistor structure located over the isolation region, the at least one of the fuse structure, the anti-fuse structure and the resistor structure comprising:
      a pad dielectric located upon the isolation region and comprising the same gate dielectric material as the gate dielectric and having a dielectric constant greater than about 10, wherein said pad dielectric and said gate dielectric material include upper surfaces that are coplanar to each other and bottom surfaces that are co-planar to each other; and
      at least one of a fuse, an anti-fuse and a resistor located upon the pad dielectric, wherein said at least one of said fuse, anti-fuse and resistor has sidewalls that are vertically coincident with sidewalls of said pad dielectric, said sidewalls of said pad dielectric are vertically offset from sidewalls of said isolation region.

2. The semiconductor structure of claim 1 wherein the at least one of the fuse, the anti-fuse and the resistor comprises the same metal material as the gate electrode.

3. The semiconductor structure of claim 1 wherein the at least one of the fuse, the anti-fuse and the resistor consists of the same metal material as the gate electrode.

4. The semiconductor structure of claim 1 wherein the at least one of the fuse, the anti-fuse and the resistor comprises the same metal material as the gate electrode and further includes a polysilicon material located upon the metal material.

5. The semiconductor structure of claim 1 wherein the at least one of the fuse, the anti-fuse and the resistor consists of a polysilicon material.

6. The semiconductor structure of claim 1 wherein the semiconductor substrate comprises a bulk semiconductor substrate.

7. The semiconductor structure of claim 1 wherein the semiconductor substrate comprises a semiconductor-on-insulator substrate.

8. The semiconductor structure of claim 1 wherein the semiconductor substrate comprises a hybrid orientation substrate.

9. The semiconductor structure of claim 1 wherein the at least one of the fuse structure, the anti-fuse structure and the resistor structure comprises a fuse structure.

10. The semiconductor structure of claim 1 wherein the at least one of the fuse structure, the anti-fuse structure and the resistor structure comprises an anti-fuse structure.

11. The semiconductor structure of claim 1 wherein the at least one of the fuse structure, the anti-fuse structure and the resistor structure comprises a resistor structure.

12. The semiconductor structure of claim 1 wherein the gate dielectric comprises a dielectric material selected from the group consisting of hafnium oxides, hafnium silicates, titanium oxides, barium-strontium-titantates and lead-zirconate-titanates.

13. The semiconductor structure of claim 1 wherein the metal material is selected from the group consisting of titanium, tungsten, tantalum, vanadium and platinum metals, metal alloys and metal nitrides.

14. The semiconductor structure of claim 1 wherein the gate dielectric material layer comprises a hafnium oxide based dielectric material and the metal gate material layer comprises a titanium nitride metal material.

15. A method for fabricating a semiconductor structure comprising:
providing a semiconductor substrate that includes an active region laterally adjacent an isolation region, wherein the isolation region has an upper surface that is co-planar with an upper surface of the semiconductor substrate;
forming upon the active region and the isolation region a gate dielectric material layer comprising a gate dielectric material having a dielectric constant greater than about 10;
forming upon the gate dielectric material layer over the active region and the isolation region a metal gate material layer comprising a metal material;
patterning the metal gate material layer and the gate dielectric material layer to simultaneously form:
a gate electrode comprising the metal material upon a gate dielectric comprising the gate dielectric material upon the active region, wherein said gate dielectric has sidewalls that are vertically coincident to sidewalls of said gate electrode; and
at least one of a fuse, an anti-fuse and a resistor comprising the metal material upon a pad dielectric comprising a portion of the gate dielectric material and having a dielectric constant greater than about 10 upon the isolation region, wherein said pad dielectric and said gate dielectric material include upper surfaces that are coplanar to each other and bottom surfaces that are co-planar to each other, wherein said at least one of said fuse, anti-fuse and resistor has vertical sidewalls that are vertically coincident with sidewalls of said pad dielectric, said sidewalls of said pad dielectric are vertically offset from sidewalls of said isolation region.

16. The method of claim 15 further comprising forming into the active region at locations not covered by the gate electrode a plurality of source and drain regions.

17. A method for fabricating a semiconductor structure comprising:
providing a semiconductor substrate that includes an active region laterally adjacent an isolation region, wherein the isolation region has an upper surface that is co-planar with an upper surface of the semiconductor substrate;
forming upon the active region and the isolation region a gate dielectric material layer comprising a gate dielectric material having a dielectric constant greater than about 10;
forming upon the gate dielectric material layer over the active region a metal gate material layer comprising a metal material;
forming upon the gate dielectric material layer over the isolation region a metal gate capping layer comprising a polysilicon material; and
patterning the metal gate material layer, the metal gate capping layer and the gate dielectric material layer to simultaneously form:
a gate electrode comprising the metal material upon a gate dielectric comprising the gate dielectric material upon the active region, wherein said gate dielectric has sidewalls that are vertically coincident to sidewalls of said gate electrode; and
at least one of a fuse, an anti-fuse and a resistor comprising the polysilicon material upon a pad dielectric comprising a portion of the gate dielectric material and having a dielectric constant greater than about 10 upon the isolation region, wherein said pad dielectric and said gate dielectric material include upper surfaces that are coplanar to each other and bottom surfaces that are co-planar to each other, wherein said at least one of said fuse, anti-fuse and resistor has vertical sidewalls that are vertically coincident with sidewalls of said pad dielectric, said sidewalls of said pad dielectric are vertically offset from sidewalls of said isolation region.

18. The method of claim 17 further comprising forming into the active region at locations not covered by the gate electrode a plurality of source and drain regions.

19. A method for fabricating a semiconductor structure comprising:
providing a semiconductor substrate that includes an active region laterally adjacent an isolation region, wherein the isolation region has an upper surface that is co-planar with an upper surface of the semiconductor substrate;

forming upon the active region and the isolation region a gate dielectric material layer comprising a gate dielectric material having a dielectric constant greater than about 10;

forming upon the gate dielectric material layer over the active region and the isolation region a metal gate material layer comprising a metal material;

forming upon the metal gate material layer over the active region and the isolation region a metal gate capping layer comprising a polysilicon material;

patterning the metal gate capping layer, the metal gate material layer and the gate dielectric material layer to simultaneously form:
- a gate electrode comprising the polysilicon material upon the metal material upon a gate dielectric comprising the gate dielectric material upon the active region; and
- at least one of a fuse, an anti-fuse and a resistor comprising the polysilicon material upon the metal material upon a pad dielectric comprising a portion of the gate dielectric material and having a dielectric constant greater than about 10 upon the isolation region, wherein said pad dielectric and said gate dielectric material include upper surfaces that are coplanar to each other and bottom surfaces that are co-planar to each other, wherein said at least one of said fuse, anti-fuse and resistor has vertical sidewalls that are vertically coincident with sidewalls of said pad dielectric, said sidewalls of said pad dielectric are vertically offset from sidewalls of said isolation region.

20. The method of claim 19 further comprising forming into the active region at locations not covered by the gate electrode a plurality of source and drain regions.

21. The method of claim 19 further comprising stripping the polysilicon material from the at least one of the fuse, the anti-fuse and the resistor, but not the gate.

* * * * *